United States Patent
Kang et al.

(10) Patent No.: US 8,034,643 B2
(45) Date of Patent: Oct. 11, 2011

(54) METHOD FOR FABRICATION OF A SEMICONDUCTOR DEVICE

(75) Inventors: Xuejun Kang, Singapore (SG); Daike Wu, Singapore (SG); Edward Robert Perry, Sedona, AZ (US); Shu Yuan, Singapore (SG)

(73) Assignee: Tinggi Technologies Private Limited, Singapore (SG)

( * ) Notice: Subject to any disclaimer, the term of this patent is extended or adjusted under 35 U.S.C. 154(b) by 235 days.

(21) Appl. No.: 10/572,525

(22) PCT Filed: Sep. 19, 2003

(86) PCT No.: PCT/SG03/00223
§ 371 (c)(1), (2), (4) Date: Oct. 26, 2007

(87) PCT Pub. No.: WO2005/029573
PCT Pub. Date: Mar. 31, 2005

(65) Prior Publication Data
US 2008/0164480 A1 Jul. 10, 2008

(51) Int. Cl.
*H01L 21/00* (2006.01)
(52) U.S. Cl. ..... 438/22; 438/29; 438/122; 257/E33.001; 257/E33.075
(58) Field of Classification Search .......... 438/15, 438/26, 122, 612, 22, 29; 257/67, E21.476, 257/E21.506, E21.531, E29.089, E33.075, 257/E33.001
See application file for complete search history.

(56) References Cited

U.S. PATENT DOCUMENTS

| | | | |
|---|---|---|---|
| 3,897,627 A | 8/1975 | Klatskin |
| 4,107,720 A | 8/1978 | Pucel et al. |
| 5,192,987 A | 3/1993 | Khan et al. |
| 5,405,804 A | 4/1995 | Yabe |
| 5,654,228 A | 8/1997 | Shieh et al. |
| 5,811,927 A | 9/1998 | Anderson et al. |
| 5,879,862 A | 3/1999 | Roh |
| 6,020,261 A | 2/2000 | Weisman |
| 6,091,085 A | 7/2000 | Lester |
| 6,169,297 B1 | 1/2001 | Jang et al. |
| 6,210,479 B1 | 4/2001 | Bojarczuk et al. |
| 6,303,405 B1 | 10/2001 | Yoshida et al. |
| 6,307,218 B1 | 10/2001 | Steigerwald et al. |

(Continued)

FOREIGN PATENT DOCUMENTS

CN 1373522 A 10/2002
(Continued)

OTHER PUBLICATIONS

Ueda, Tetsuzo et al., "Vertical InGaN-based blue light emitting diode with plated metal base fabricated using laser lift-off technique," Phys. Stat. Sol.(c) 0, No. 7, Oct. 20, 2003, pp. 2219-2222, Wiley-VCH Verlag GmbH & Co., KGaA, Weinhem, 2003.

(Continued)

*Primary Examiner* — Khiem D Nguyen
(74) *Attorney, Agent, or Firm* — Blakely, Sokoloff, Taylor & Zafman LLP.

(57) ABSTRACT

A method for fabrication of a semiconductor device on a substrate, the semiconductor having a wafer. The method includes the steps:(a) applying a seed layer of a thermally conductive metal to the wafer;(b) electroplating a relatively thick layer of the conductive metal on the seed layer, and(c) removing the substrate. A corresponding semiconductor device is also disclosed.

14 Claims, 5 Drawing Sheets

U.S. PATENT DOCUMENTS

| | | |
|---|---|---|
| 6,319,778 B1 | 11/2001 | Chen et al. |
| 6,365,429 B1 | 4/2002 | Kneissl et al. |
| 6,380,564 B1 | 4/2002 | Chen et al. |
| 6,420,242 B1 | 7/2002 | Cheung et al. |
| 6,420,732 B1 | 7/2002 | Kung et al. |
| 6,426,512 B1 | 7/2002 | Ito et al. |
| 6,448,102 B1 | 9/2002 | Kneissl et al. |
| 6,455,870 B1 | 9/2002 | Wang et al. |
| 6,492,661 B1 * | 12/2002 | Chien et al. ............ 257/98 |
| 6,509,270 B1 | 1/2003 | Held |
| 6,562,648 B1 | 5/2003 | Wong et al. |
| 6,573,537 B1 | 6/2003 | Steigerwald et al. |
| 6,589,857 B2 | 7/2003 | Ueda et al. |
| 6,627,921 B2 | 9/2003 | Wong et al. |
| 6,627,989 B2 | 9/2003 | Kohno et al. |
| 6,649,437 B1 * | 11/2003 | Yang et al. ............ 438/30 |
| 6,677,173 B2 | 1/2004 | Ota |
| 6,821,804 B2 | 11/2004 | Thibeault et al. |
| 7,338,822 B2 | 3/2008 | Wu et al. |
| 7,348,212 B2 | 3/2008 | Schiaffino et al. |
| 2001/0055324 A1 | 12/2001 | Ota |
| 2002/0022286 A1 | 2/2002 | Nikolaev et al. |
| 2002/0034835 A1 | 3/2002 | Chen et al. |
| 2002/0093023 A1 | 7/2002 | Camras et al. |
| 2002/0113279 A1 | 8/2002 | Hanamaki et al. |
| 2002/0117681 A1 | 8/2002 | Weeks et al. |
| 2002/0134985 A1 | 9/2002 | Chen et al. |
| 2002/0137243 A1 | 9/2002 | Chen et al. |
| 2002/0179910 A1 | 12/2002 | Slater, Jr. |
| 2003/0038284 A1 | 2/2003 | Kurahashi et al. |
| 2003/0064535 A1 | 4/2003 | Kub et al. |
| 2003/0111667 A1 | 6/2003 | Schubert |
| 2003/0151357 A1 | 8/2003 | Uemura |
| 2003/0178626 A1 | 9/2003 | Sugiyama et al. |
| 2003/0189212 A1 | 10/2003 | Yoo |
| 2003/0189215 A1 | 10/2003 | Lee et al. |
| 2003/0218179 A1 | 11/2003 | Koide et al. |
| 2004/0026709 A1 | 2/2004 | Bader et al. |
| 2004/0031967 A1 | 2/2004 | Fudeta et al. |
| 2004/0065889 A1 | 4/2004 | Ueda et al. |
| 2004/0104395 A1 | 6/2004 | Hagimoto et al. |
| 2004/0110395 A1 | 6/2004 | Ueda et al. |
| 2004/0130037 A1 | 7/2004 | Mishra et al. |
| 2004/0217362 A1 | 11/2004 | Slater, Jr. et al. |
| 2004/0235210 A1 | 11/2004 | Tamura et al. |
| 2005/0014303 A1 | 1/2005 | Tsai et al. |
| 2005/0026399 A1 | 2/2005 | Chien et al. |
| 2005/0035354 A1 | 2/2005 | Lin et al. |
| 2005/0082555 A1 | 4/2005 | Chien et al. |
| 2005/0087884 A1 | 4/2005 | Stokes et al. |
| 2005/0093002 A1 | 5/2005 | Tsai et al. |
| 2005/0098792 A1 | 5/2005 | Lee et al. |
| 2005/0127397 A1 | 6/2005 | Borges et al. |
| 2005/0164482 A1 | 7/2005 | Saxler |
| 2005/0173692 A1 | 8/2005 | Park et al. |
| 2006/0099730 A1 | 5/2006 | Lee et al. |
| 2006/0124939 A1 | 6/2006 | Lee et al. |
| 2006/0151801 A1 | 7/2006 | Doan et al. |
| 2006/0154390 A1 | 7/2006 | Tran et al. |
| 2006/0154391 A1 | 7/2006 | Tran et al. |
| 2006/0154392 A1 | 7/2006 | Tran et al. |
| 2006/0154393 A1 | 7/2006 | Doan et al. |
| 2006/0157721 A1 | 7/2006 | Tran et al. |
| 2006/0163586 A1 | 7/2006 | Denbaars et al. |
| 2006/0186418 A1 | 8/2006 | Edmond et al. |
| 2007/0029541 A1 | 2/2007 | Xin et al. |
| 2008/0164480 A1 | 7/2008 | Kang et al. |
| 2008/0210970 A1 | 9/2008 | Kang et al. |
| 2008/0265366 A1 | 10/2008 | Guo et al. |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 10-117016 | 5/1998 |
| JP | 2000-164928 | 6/2000 |
| JP | 2000183400 A | 6/2000 |
| JP | 2000-277804 | 10/2000 |
| JP | 2000294837 A | 10/2000 |
| JP | 2001-036129 | 2/2001 |
| JP | 2001-049491 | 2/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2005-012188 | 1/2005 |
| JP | 2005-236048 | 9/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506301-1 | 9/2005 |
| SG | 200506897-8 | 10/2005 |
| SG | 200508210-2 | 12/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 | 7/2003 |
| WO | WO 01/47039 A1 | 6/2001 |
| WO | WO 2004/102686 A1 | 11/2004 |
| WO | WO 2005/029572 A1 | 3/2005 |
| WO | WO 2005/064666 A1 | 7/2005 |
| WO | WO 2005/088743 A1 | 9/2005 |
| WO | WO 2005/098974 A1 | 10/2005 |
| WO | WO 2007/046773 A1 | 4/2007 |
| WO | WO 2007/037762 A1 | 5/2007 |
| WO | WO 2007/073354 A1 | 6/2007 |
| WO | WO 2008/020819 A1 | 2/2008 |
| WO | WO 2008/030188 A1 | 3/2008 |

OTHER PUBLICATIONS

Chu, Chen F., et al., "Comparison of p-Side Down and p-Side Up GaN Light-Emitting Diodes Fabricated by Laser Lift-Off", *Japan Journal of Applied Physics*, vol. 42, (Feb. 15, 2003), 147-150.

Li, W H., et al., "Electrochemical deposition of Copper on patterned Cu/Ta(N)SiO2 surfaces for super filling of sub-micron features", *Journal of Applied Electrochemistry*, vol. 31, (2001), 1395-1397.

M.K. Kelly, O. Ambacher, R. Dimitrov, R. Handschuh, and M. Stutzmann, "Optical Process for Liftoff of Group III-Nitride Films," Phys. Stat. Sol. (a) 159, pp. R3-R4 (1997).

International Search Report for PCT Counterpart PCT/SG03/00223 (Dec. 2, 2003).

Zhifang Fan, et al., "Very Low Resistance Multilayer Ohmic Contact to n-GaN," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN—GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the p-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P$/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAlP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Application No. PCT/SG2006/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

PCT International Preliminary Examination Report for PCT Counterpart Application No. PCT/SG2003/000223, 14 pgs., (Oct. 5, 2005).

\* cited by examiner

METHOD FOR FABRICATION OF A SEMICONDUCTOR DEVICE

CROSS-REFERENCE TO OTHER APPLICATIONS

This is a National Phase of International Application No. PCT/SG2003/000223, filed on Sep. 19, 2003.

FIELD OF THE INVENTION

The present invention relates to the fabrication of semiconductor devices and refers particularly, though not exclusively, to the plating of a heat sink on the semiconductor device.

BACKGROUND TO THE INVENTION

As semiconductor devices have developed there has been a considerable increase in their operational speed, and a reduction in overall size. This is causing a major problem of heat build-up in the semiconductor devices. Therefore, heat sinks are being used to help dissipate the heat from the semiconductor device. Such heat sinks are normally fabricated separately from the semiconductor device and are normally adhered to the semiconductor device just prior to encapsulation.

There have been many proposals for the electroplating of copper onto surfaces of semiconductor devices during their fabrication, particularly for use as interconnects.

The majority of current semiconductor devices are made from semiconductor materials based on silicon (Si), gallium arsenide (GaAs), and indium phosphide (InP). Compared to such electronic and optoelectronic devices, GaN devices have many advantages. The major intrinsic advantages that GaN have are summarised in Table 1:

TABLE 1

| Semiconductor | Mobility μ (cm²/Vs) | Band Gap (eV)/ wavelength (nm) | BFOM (power transistor merit) | Maximum Temperature (C.) |
|---|---|---|---|---|
| Si | 1300 | 1.1/1127 | 1.0 | 300 |
| GaAs | 5000 | 1.4/886 | 9.6 | 300 |
| GaN | 1500 | 3.4/360 | 24.6 | 700 |

From Table 1, it can be seen that GaN has the highest band gap (3.4 eV) among the given semiconductors. Thus, it is called a wide band gap semiconductor. Consequently, electronic devices made of GaN operate at much higher power than Si and GaAs and InP devices.

For semiconductor lasers, GaN lasers have a relatively short wavelength. If such lasers are used for optical data storage, the shorter wavelength may lead to a higher capacity. GaAs lasers are used for the manufacture of CD-ROMs with a capacity of about 670 MB/disk. AlGaInP lasers (also based on GaAs) are used for the latest DVD players with a capacity of about 4.7 GB/disk. GaN lasers in the next-generabon DVD players may have a capacity of 26 GB/disk.

GaN devices are made from GaN wafers that are typically multiple GaN-related epitaxial layers deposited on a sapphire substrate. The sapphire substrate is usually two inches in diameter and acts as the growth template for the epitaxial layers. Due to lattice mismatch between GaN-related materials (epitaxial films) and sapphire, defects are generated in the epitaxial layers. Such defects cause serious problems for GaN lasers and transistors and, to a lesser extent, for GaN LEDs.

There are two major methods of growing epitaxial wafers: molecular beam epitaxy (MBE), and metal organic chemical vapour deposition (MOCVD). Both are widely used.

Conventional fabrication processes usually include these major steps: photolithography, etching, dielectric film deposition, metallization, bond pad formation, wafer inspection/testing, wafer thinning, wafer dicing, chip bonding to packages, wire bonding and reliability testing.

Once the processes for making LEDs are completed at the full wafer scale, it is then necessary to break the wafer into individual LED chips or dice. For GaN wafers grown on sapphire substrates, this "dicing" operation is a major problem as sapphire is very hard. The sapphire first has to be thinned uniformly from about 400 microns to about 100 microns. The thinned wafer is then diced by diamond scriber, sawed by a diamond saw or by laser grooving, followed by scribing with diamond scribers. Such processes limit throughput, cause yield problems and consume expensive diamond scribers/saws.

Known LED chips grown on sapphire substrates require two wire bonds on top of the chip. This is necessary because sapphire is an electrical insulator and current conduction through the 100-micron thickness is not possible. Since each wire bond pad takes about 10-15% of the wafer area, the second wire bond reduces the number of chips per wafer by about 10-15% as compared to single-wire bond LEDs grown on conducting substrates. Almost all non-GaN LEDs are grown on conducting substrates and use one wire bond. For packaging companies, two wire bonding reduces packaging yield, requires modification of one-wire bonding processes, reduces the useful area of the chip, and complicates the wire bonding process and thus lowers packaging yield.

Sapphire is not a good thermal conductor. For example, its thermal conductivity at 300 K (room temperature) is 40 W/Km. This is much smaller than copper's thermal conductivity of 380 W/Km. If the LED chip is bonded to its package at the sapphire interface, the heat generated in the active region of the device must flow through 3 to 4 microns of GaN and 100 microns of sapphire to reach the package/heat sink. As a consequence, the chip will run hot affecting both performance and reliability.

For GaN LEDs on sapphire, the active region where light is generated is about 3-4 micron from the sapphire substrate.

SUMMARY OF THE INVENTION

In accordance with a preferred form of the present invention, there is provided a method for fabrication of a semiconductor device on a substrate, the semiconductor device having wafer with a device layer; the method including the steps:
  (a) electroplating a layer of a thermally conductive material onto a surface of the wafer remote from the substrate and close to the device layer; and
  (b) removing the substrate.

The semiconductor device may be a silicon-based device.

In accordance with another form, there is provided a method for fabrication of a light emitting device on a substrate, the light emitting device having wafer with an active layer; the method including the steps:
  (a) electroplating a layer of a thermally conductive material onto a surface of the wafer remote from the substrate and close to the active layer; and
  (b) removing the substrate.

For both forms, the thermally conductive layer may be as a heat sink, and may be of a thickness in the range of from 3 microns to 300 microns, preferably 50 to 200 microns.

In a further form, the present invention provides a method for fabrication of a semiconductor device on substrate, the semiconductor device having a wafer; the method including the steps:
(a) applying a seed layer of a thermally conductive metal to a first surface of the wafer remote from the substrate;
(b) electroplating a relatively thick layer of the thermally conductive metal on the seed layer; and
(c) removing the substrate.

Prior to the seed layer being applied, the wafer may be coated with an adhesion layer. Before the electroplating of the relatively thick layer the seed layer may be patterned with photoresist patterns; the relatively thick layer being electroplated between the photoresists.

The seed layer may be electroplated without patterning and with patterning being performed subsequently. Patterning may be by photoresist patterning and then wet etching. Alternatively, it may be by laser beam micro-machining of the relatively thick layer.

Between steps (b) and (c) there may be performed the additional step of annealing the wafer to improve adhesion.

Preferably, the photoresists are of a height of at least 15 to 500 microns, more preferably 50 to 200 microns, and have a thickness in the range 3 to 500 microns. More preferably, the photoresists have a spacing in the range of 200 to 2,000 microns, preferably 300 microns.

The relatively thick layer may be of a height no greater that the photoresist height Alternatively, the conductive metal layer may be electroplated to a height greater than the photoresist and be subsequently thinned. Thinning may be by polishing or wet etching.

After step (c) there may be included an extra step of forming on a second surface of the wafer remote from the relatively thick layer, a second ohmic contact layer. The contact layer may be a second ohmic contact layer. The second ohmic contact layer may be one of opaque, transparent, and semi-transparent, and may be either blank or patterned. Ohmic contact formation and subsequent process steps may be carried out The subsequent process steps may include deposition of wire bond pads. The exposed second surface of the wafer layer may be cleaned and etched before the second ohmic contact layer is deposited onto it The second ohmic contact layer may not cover the whole area of the second surface of the wafer.

The semiconductor devices may be tested on the wafer, and the wafer may be subsequently separated into individual devices.

The semiconductor devices may be fabricated without one or more of lapping, polishing and dicing.

The wafer may include epitaxial layers and, on the epitaxial layers remote from the substrate, first ohmic contact layers. The first ohmic contact layers may be on p-type layers of the epitaxial layers; and the second ohmic contact layer may be formed on n-type layers of the expitaxial layers.

After step (c), dielectric films may be deposited on the epitaxial layers. Openings may then be cut in the dielectric and second ohmic contact layer and bond pads deposited on the epitaxial layers. Alternatively, after step (c), electroplating of a thermally conductive metal (or other material) on the epitaxial layers may be performed.

The invention is also directed to a semiconductor device fabricated by the above method. The invention, in a preferred aspect, also provides a light emitting diode or a laser diode fabricated by the above method.

In a further aspect, the present invention provides a semiconductor device comprising epitaxial layers, a first ohmic contact layer on a first surface of the epitaxial layers, a relatively thick layer of a thermally conductive metal on the first ohmic contact layer, and a second ohmic contact layer on a second surface of the epitaxial layers; the relatively thick layer being applied by electroplating.

There may be an adhesive layer on the first ohmic contact layer between the first ohmic contact layer and the relatively thick layer.

The relatively thick layer may be at least 50 micrometers thick; and the second ohmic contact layer may be a thin layer in the range of from 3 to 500 nanometers. The second ohmic contact layer may be transparent, semi-transparent or opaque; and may include bonding pads.

For all forms of the invention, the thermally conductive metal may be copper.

There may be a seed layer of the thermally conductive metal applied to the adhesive layer.

The semiconductor device may be one of a light emitting diode, a laser diode, and a transistor device.

In yet another form, there is provided a semiconductor device comprising epitaxial layers, a first ohmic contact layer on a first surface of the epitaxial layers, an adhesive layer on the first ohmic contact layer, and a seed layer of a thermally conductive metal on the adhesive layer.

There may be further included a relatively thick layer of the thermally conductive metal on the seed layer.

A second ohmic contact layer may be provided on a second surface of the epitaxial layers; the second ohmic contact layer being a thin layer in the range of from 3 to 500 nanometers. The second ohmic contact layer may comprise bonding pads; and may be one of opaque, transparent, and semi-transparent The thermally conductive metal may comprise copper; and the epitaxial layers may comprise GaN-related layers.

The semiconductor device may be a light emitting device.

In a penultimate form, the present invention provides a method of fabrication of a semiconductor device, the method including the steps:
(a) on a substrate with a wafer comprising multiple GaN-related epitaxial layers, forming a first ohmic contact layer on a first surface of the wafer;
(b) removing the substrate from the wafer; and
(c) forming a second ohmic contact layer on a second surface of the wafer, the second ohmic contact layer having bonding pads formed thereon.

The second ohmic contact layer may be for light emission; and may be opaque, transparent, or semitransparent The second ohmic contact layer may be blank or patterned.

In a final form, there is provided a semiconductor device fabricated by the above method.

The semiconductor device may be a light emitting diode or a laser diode.

BRIEF DESCRIPTION OF THE DRAWINGS

In order that the invention may be better understood and readily put into practical effect there shall now be described by way of non-limitative example only a preferred embodiment of the present invention, the description being with reference to the accompanying illustrative (and not to scale) drawings in which.

DETAILED DESCRIPTION OF THE PREFERRED EMBODIMENT

Figure 8:
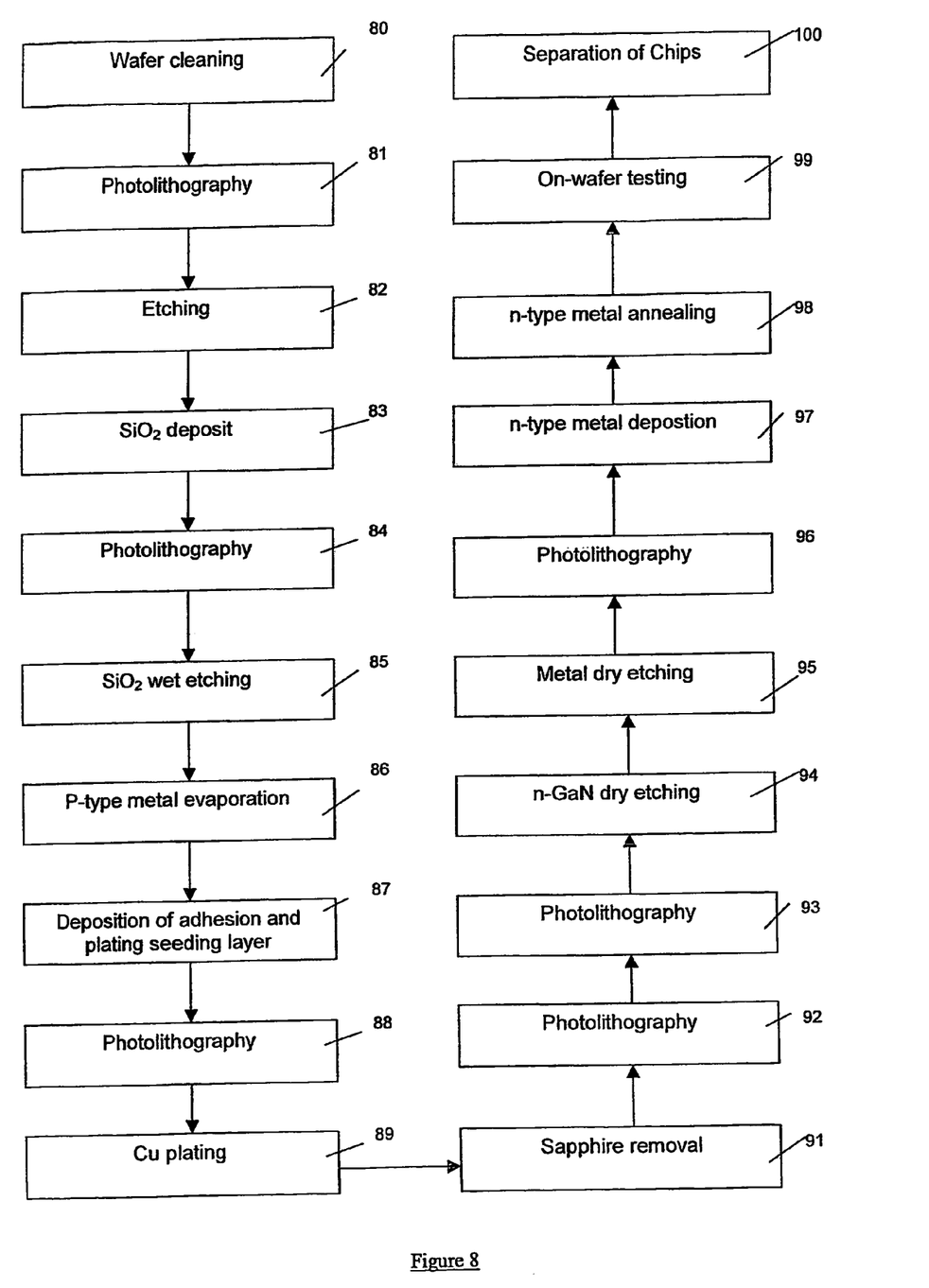
FIG. 8 is a flow chart of the process.

For the following description, the reference numbers in brackets refer to the process steps in FIG. 8.

Figure 1:
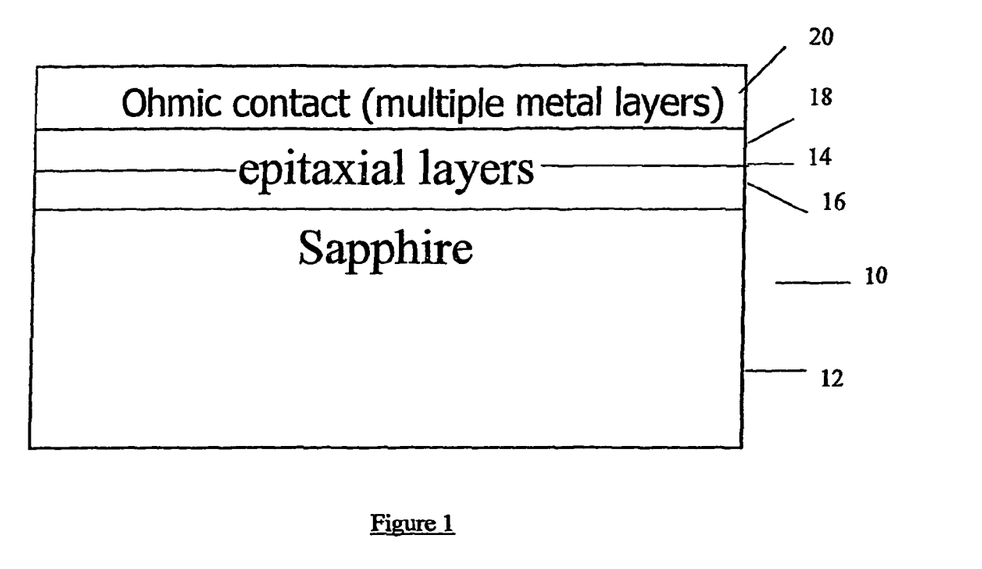
FIG. 1 is a schematic representation of a semiconductor device at a first stage in the fabrication process.

To refer to FIG. 1, there is shown the first step in the process—the metallization on the p-type surface of the wafer 10.

The wafer 10 is an epitaxial wafer with a substrate and a stack of multiple epitaxial layers 14 on it The substrate 12 can be, for example, sapphire, GaAs, InP, Si, and so forth. Henceforth a GaN sample having GaN layer(s) 14 on sapphire substrate 12 will be used as an example. The epitaxial layers 14 (often called epilayers) are a stack of multiple layers, and the lower part 16 (which is grown first on the substrate) is usually n-type layers and the upper part 18 is often p-type layers.

Figure 2:
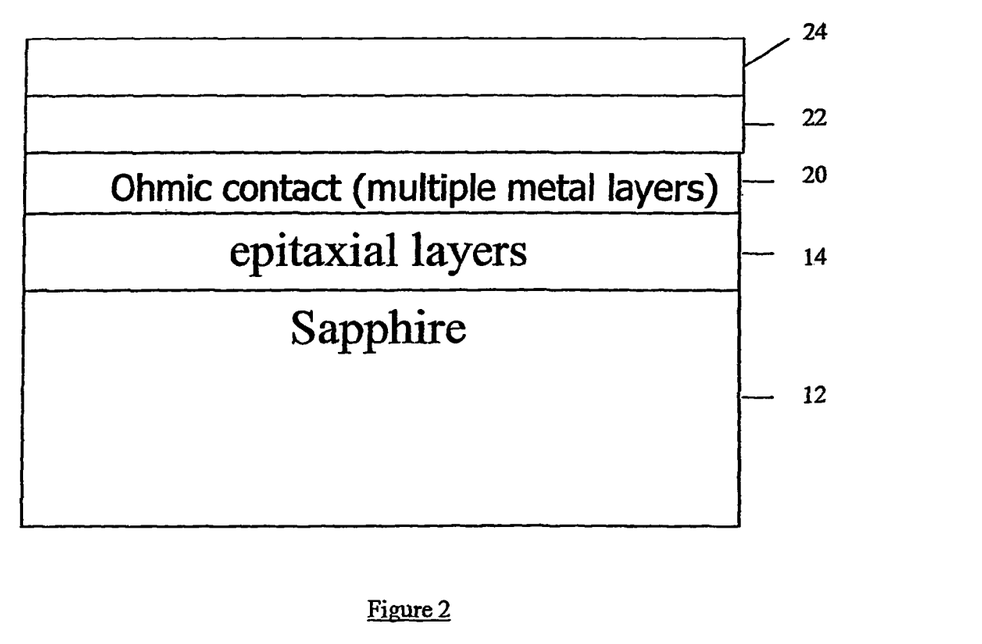
FIG. 2 is a schematic representation of the semiconductor device of FIG. 1 at a second stage in the fabrication process.

On GaN layers 14 is an ohmic contact layer 20 having multiple metal layers. To ohmic contact layer 20 is added an adhesion layer 22, and a thin copper seed layer 24 (FIG. 2) (step 88) of a thermally conductive metal such as, for example, copper. The thermally conductive metal is preferably also electrically conductive. The stack of adhesion layers may be annealed after formation.

The ohmic layer 20 may be a stack of multiple layers deposited and annealed on the semiconductor surface. It may not be part of the original wafer. For GaN, GaA, and InP devices, the epitaxial wafer often contains an active region that is sandwiched between n-type and p-type semiconductors. In most cases the top layer is p-type. For silicon devices, epitaxial layers may not be used, but just the wafer.

Figure 3:
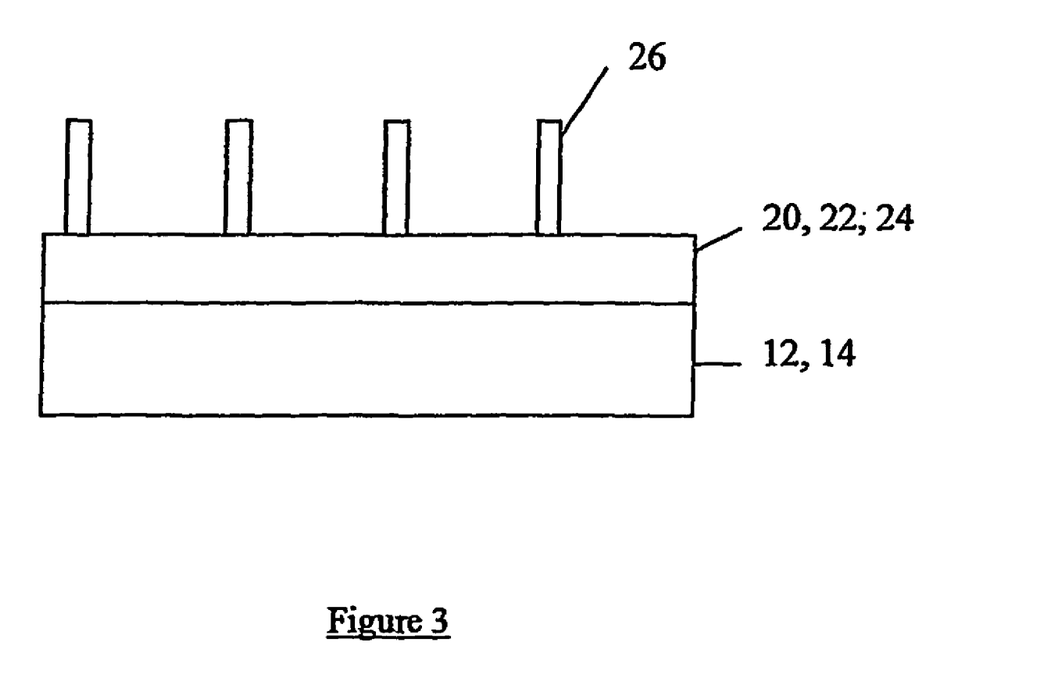
FIG. 3 is a schematic representation of the semiconductor device of FIG. 1 at a third stage in the fabrication process.

As shown in FIG. 3, using standard photolithography (89), the thin copper seed layer 24 is patterned with relatively thick photoresists 26. The photoresist patterns 26 are preferably of a height in the range of 3 to 500 micrometers, preferably 15 to 500 micrometers; and with a thickness of about 3 to 500 micrometers. They are preferably separated from each other by a spacing in the range of 200 to 2,000 microns, preferably 300 microns, depending on the design of the final chips. The actually pattern depends on device design.

A patterned layer 28 of copper is then electroplated onto layer 24 (90) between photoresists 26 to form a heat sink that forms a part of the substrate. The copper layer 28 is preferably of a height no greater than that of the photoresists 26 and is therefore of the same or lesser height than the photoresists 26. However, the copper layer 28 may be of a height greater than that of the photoresists 26. In such a case, the copper layer 28 may be subsequently thinned to be of a height no greater than that of the photoresists 26. Thinning may be by polishing or wet etching. The photoresists 26 may or may not be removed after the copper plating. Removal may be by a standard and known method such as, for example, resin in the resist stripper solution, or by plasma aching.

Figure 4:
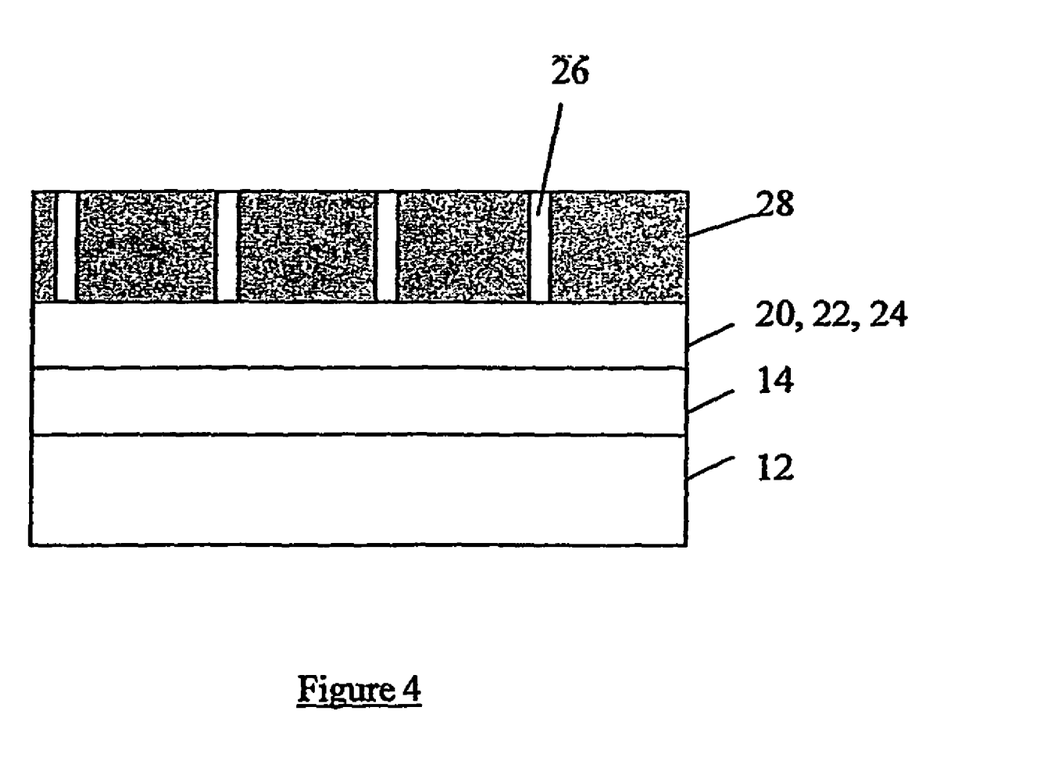
FIG. 4 is a schematic representation of the semiconductor device of FIG. 1 at a fourth stage in the fabrication process.

Depending on the device design, processing of the epitaxial layers 14 follows using standard processing techniques such as, for example, cleaning, (80), lithography (81), etching (82), device isolation (83), passivation (84), metallization (85), thermal processing (86), and so forth. (FIG. 4). The wafer 10 is then annealed (87) to improve adhesion.

The epitaxial layer 14 is usually made of n-type layers 16 on the original substrate 12; and p-type layers on the original top surface 18 which is now covered with the ohmic 20, adhesion 22 and copper seed layers 24 and the electroplated thick copper layer 28.

Figure 5:
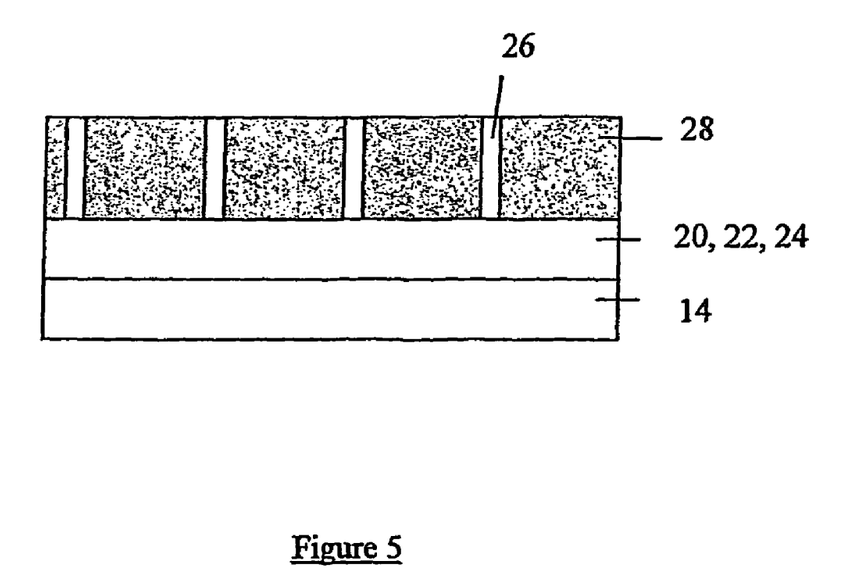
FIG. 5 is a schematic representation of the semiconductor device of FIG. 1 at a fifth stage in the fabrication process.

In FIG. 5, the original substrate layer 12 is then removed (91) using, for example, the method of Kelly [M. K Kelly, O. Ambacher, R. Dimitrov, R. Handschuh, and M. Stutzmann, phys. stat sol. (a) 159, R3 (1997)]. The substrate may also be removed by polishing or wet etching.

Figure 6:
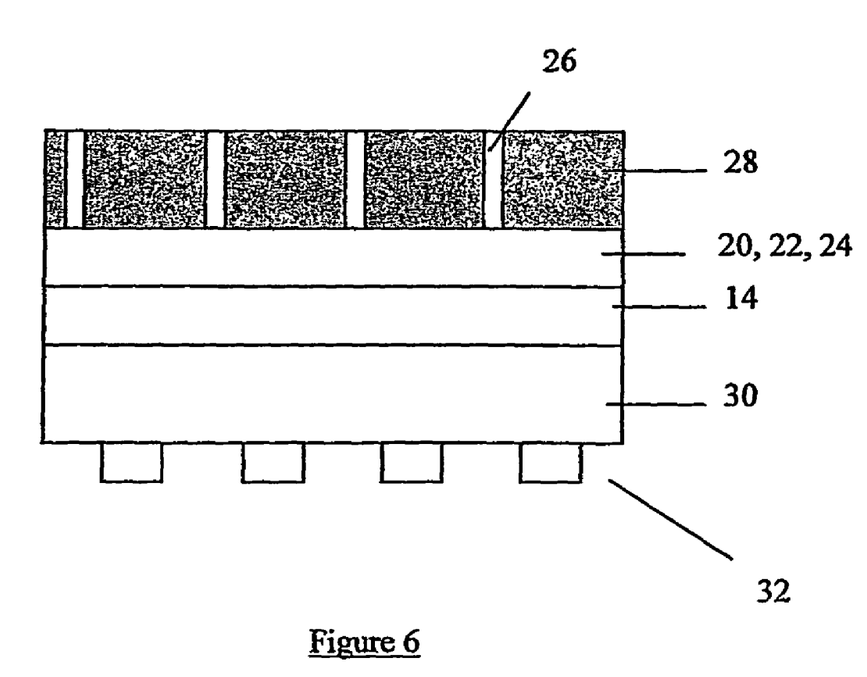
FIG. 6 is a schematic representation of the semiconductor device of FIG. 1 at a sixth stage in the fabrication process.

FIG. 6 is the penultimate step and is particularly relevant for light emitting diodes where a transparent ohmic contact layer 30 is added beneath epitaxial layers 14 for light emission. Bonding pads 32 are also added. The Ohmic contact layer 30 is preferably transparent or semi-transparent It is more preferably a thin layer and may be in the range of 3 to 50 nm thick.

Prior to adding ohmic contact layer 30, known preliminary processes may be performed. These may be, for example, photolithography (92, 93), dry etching (94, 95), and photolithography (96).

Annealing (98) may follow the deposition of ohmic contact layer 30.

Figure 7:
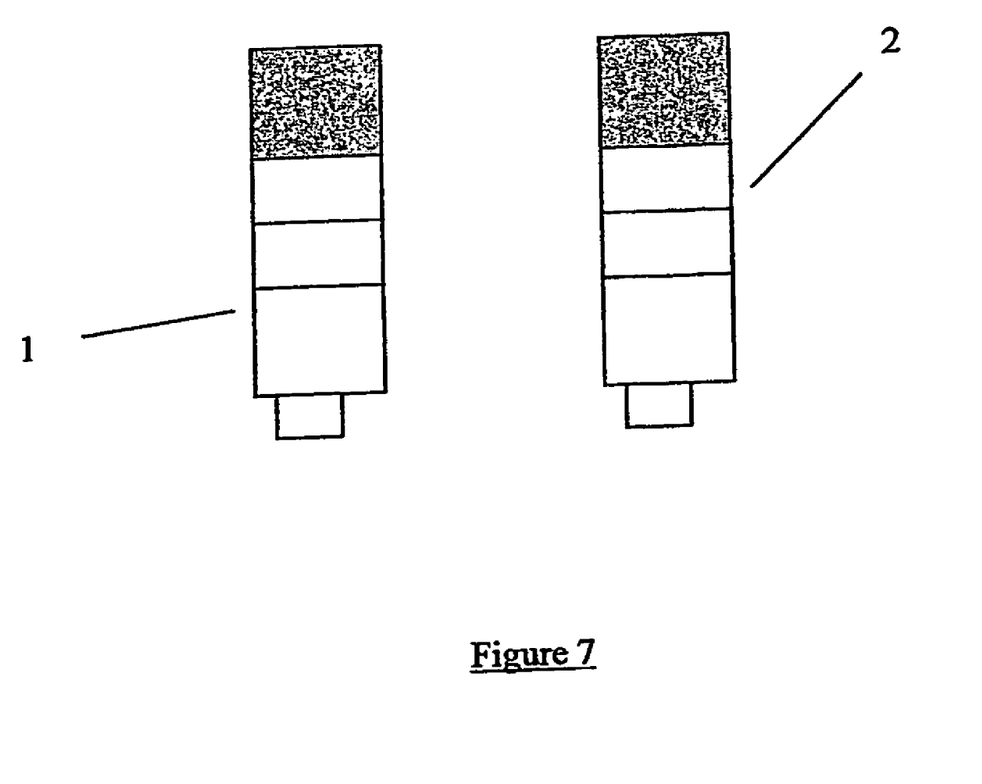
FIG. 7 is a schematic representation of the semiconductor device of FIG. 1 at the seventh stage in the fabrication process.

The chips/dies are then tested (99) by known and standard methods. The chips/dies can then be separated (100) (FIG. 7) into individual devices/chips 1 and 2 without lapping/polishing the substrate, and without dicing. Packaging follows by standard and known methods.

The top surface of the epitaxial layer 14 is preferably in the range of about 0.1 to 2.0 microns, preferably about 0.3 microns, from the active region. For silicon-based semiconductors, the top surface of the semiconductor is preferably in the range 0.1 to 2.0 microns, preferably about 0.3 microns, from the device layer. As the active layer/device layer in this configuration is close to az relatively thick copper pad 28, the rate of heat removal is improved.

Additionally or alternatively, the relatively thick layer 28 may be used to provide mechanical support for the chip. It may also be used to provide a path for heat removal from the active region/device layer, and may also be used for electrical connection.

The plating step is performed at the wafer level (i.e., before the dicing operation) and may be for several wafers at the one time.

The fabrication of GaN laser diodes is similar to the fabrication of GaN LEDs, but more steps may be involved. One difference is that GaN laser diodes require mirror formation during the fabrication. Using sapphire as the substrate compared to the method without sapphire as the substrate, the mirror formation is much more difficult and the quality of the mirror is generally worse.

After sapphire is removed, the laser will have better performance. An example of a typical GaN laser epitaxial wafer structure is shown in Table 2.

TABLE 2

| | |
|---|---|
| Mg doped p-type GaN contact layer | 0.15 µm |
| Mg doped p-type $Al_{0.15}Ga_{0.85}N$ cladding layer | 0.45 µm |
| Mg doped p-type GaN wave guiding layer | 0.12 µm |
| Mg doped p-type $Al_{0.2}Ga_{0.8}N$ electron blocking layer | 200 |
| $In_{0.03}Ga_{0.97}N/In_{0.16}Ga_{0.74}N$ 3-period MQWs active layer | |
| $In_{0.10}GaN_{0.90}N$ well layer | 35 |
| $In_{0.03}Ga_{0.97}N$ barrier layer | 50 |
| Si doped n-type GaN wave guiding layer | 0.12 µm |

TABLE 2-continued

| | |
|---|---|
| Si doped n-type $Al_{0.15}Ga_{0.85}N$ cladding layer | 0.45 μm |
| Si doped n-type $In_{0.1}Ga_{0.9}N$ | 500 |
| Si doped n-type GaN contact layer | 3 μm |
| Un-doped n-type GaN | 1 μm |
| Un-doped n-type ELO GaN layer | 6 μm |
| Un-doped GaN template layer/$Si_3N_4$ mask | 2 μm |
| GaN buffer | 300 |
| Sapphire substrate | 450 μm |

For standard commercial GaN LEDs, about 5% light generated in the semiconductor is emitted. Various ways have been developed to extract more light out from the chip in non-GaN LEDs (especially red LEDs based on AlGaInP, not GaN).

The first ohmic contact layer 20, being metal and relatively smooth, is quite shiny and therefore highly reflective of light. As such, the first ohmic contact layer 20, at its junction with the epitaxial layers 14, also is a reflective surface, or mirror, to improve light output.

Although reference is made to copper, any other platable material may be used m provided it is electrically and/or heat conductive, or provides the mechanical support for the semiconductor device.

Whilst there has been described in the foregoing description a preferred form of the present invention, it will be understood by those skilled in the technology that many variations or modifications in design, construction or operation may be made without departing from the present invention.

The invention claimed is:

1. A method for fabrication of a semiconductor device, the method including:
   providing a wafer comprising a substrate with multiple epitaxial layers mounted on a substrate, the multiple epitaxial layers comprising an active region where light is able to be generated;
   forming a first ohmic contact layer on a first surface of the multiple epitaxial layers, the first surface being remote from the substrate, the first ohmic contact layer comprising multiple metal layers and the first ohmic contact layer being a mirror at a junction between the first surface of the multiple epitaxial layers and the first ohmic contact layer;
   coating the first ohmic contact layer with an adhesion layer prior to application of a seed layer of a thermally conductive metal, wherein the seed layer is formed on the adhesion layer by electroplating and the seed layer is patterned with photoresist patterns before the electroplating;
   forming a relatively thick layer of the thermally conductive metal between the photoresist patterns and adjacent to the first ohmic contact layer, the thermally conductive metal being of sufficient thickness to provide a heat sink; and
   removing the substrate.

2. A method as claimed in claim 1, wherein between the forming of the first ohmic contact layer and the forming a relatively thick layer of a thermally conductive metal, the method further comprises annealing the layers to improve adhesion, and wherein the photoresist patterns are of a height in the range 15 to 500 micrometers, a thickness in the range 3 to 500 micrometers, and a spacing in the range of 200 to 2,000 microns.

3. A method as claimed in claim 1, wherein patterning is by laser beam micro-machining of the relatively thick layer.

4. A method as claimed in claim 1, wherein the relatively thick layer is of a height no greater than the photoresist height.

5. A method as claimed in claim 1, wherein the relatively thick layer of thermally conductive metal is electroplated to a height greater than the photoresist and is subsequently thinned, thinning being by polishing or wet etching.

6. A method as claimed in claim 1, wherein after the removing of the substrate, the method further comprises forming on a second surface of the multiple epitaxial layers a second ohmic contact layer, the second ohmic contact layer being selected from the group consisting of: opaque, transparent, and semi-transparent, the second ohmic contact layer being one of blank and patterned, bonding pads being formed on the second ohmic contact layer.

7. A method as claimed in claim 1, wherein after the removing of the substrate, the method further comprises forming an ohmic contact and subsequent processing, the subsequent processing including deposition of wire bond pads.

8. A method as claimed in claim 6, wherein the second surface is cleaned and etched before the second ohmic contact layer is deposited, the second ohmic contact layer not covering the whole area of the second surface.

9. A method as claimed in claim 6, wherein a plurality of semiconductor devices are fabricated on the wafer, and wherein after forming the second ohmic contact layer there is included testing of the semiconductor devices on the wafer, and separating the layers into individual devices.

10. A method as claimed in claim 1, wherein a plurality of semiconductor devices are fabricated on the wafer without one or more selected from the group consisting of: lapping, polishing and dicing.

11. A method as claimed in claim 6, wherein the first ohmic contact layer is on p-type layers of the multiple epitaxial layers.

12. A method as claimed in claim 11, wherein the second ohmic contact layer is formed on n-type layers of the multiple epitaxial layers.

13. A method as claimed in claim 1, wherein after the removing of the substrate, the method further comprising
   depositing dielectric films on the multiple epitaxial layers; and
   cutting openings in the dielectric films, the second ohmic contact layer, and the bond pads deposited on the multiple epitaxial layers.

14. A method as claimed in claim 1, wherein the thermally conductive metal comprises copper and the multiple epitaxial layers comprise multiple GaN-related layers.

* * * * *